(12) United States Patent
Hsu et al.

(10) Patent No.: US 7,323,349 B2
(45) Date of Patent: Jan. 29, 2008

(54) SELF-ALIGNED CROSS POINT RESISTOR MEMORY ARRAY

(75) Inventors: Sheng Teng Hsu, Camas, WA (US);
Jong-Jan Lee, Camas, WA (US);
Jer-Shen Maa, Vancouver, WA (US);
Douglas J. Tweet, Camas, WA (US);
Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 432 days.

(21) Appl. No.: 11/120,385

(22) Filed: May 2, 2005

(65) Prior Publication Data

US 2006/0246606 A1    Nov. 2, 2006

(51) Int. Cl.
*H01L 21/00* (2006.01)
*H01L 21/8242* (2006.01)

(52) U.S. Cl. ............ 438/3; 438/128; 438/FOR. 189; 438/FOR. 212; 257/E21.663; 257/E21.665; 257/E27.002; 257/E27.067; 257/E27.075; 257/E27.077; 257/E27.078; 257/E27.084; 257/E27.085; 257/E27.104

(58) Field of Classification Search ............ 438/3, 438/FOR. 189, FOR. 212; 257/E21.663, 257/E21.665, E27.002, E27.67, E27.075, 257/E27.076, E27.077, E27.078, E27.084, 257/E27.085, E27.104, E29.308
See application file for complete search history.

(56) References Cited

U.S. PATENT DOCUMENTS

| 6,531,371 B2 | 3/2003 | Hsu et al. |
| 6,693,821 B2 | 2/2004 | Hsu et al. |
| 2003/0142578 A1 | 7/2003 | Hsu et al. |
| 2004/0063274 A1* | 4/2004 | Hsu et al. ............ 438/238 |

OTHER PUBLICATIONS

Liu et al., *Electric-pulse induced reversible resistance change effect in magnetoresistive film*, Applied Physics Letters, vol. 76, No. 19, p. 2749, May 2000.

* cited by examiner

*Primary Examiner*—Carl Whitehead, Jr.
*Assistant Examiner*—Maliheh Malek

(57) ABSTRACT

A method of fabricating resistor memory array includes preparing a silicon substrate; depositing a bottom electrode, a sacrificial layer, and a hard mask layer on a substrate P+ layer; masking, patterning and etching to remove, in a first direction, a portion of the hard mask, the sacrificial material, the bottom electrode; depositing a layer of silicon oxide; masking, patterning and etching to remove, in a second direction perpendicular to the first direction, a portion of the hard mask, the sacrificial material, the bottom electrode;, and over etching to an N+ layer and at least 100 nm of the silicon substrate; depositing of a layer of silicon oxide; etching to remove any remaining hard mask and any remaining sacrificial material; depositing a layer of CMR material; depositing a top electrode; applying photoresist, patterning the photoresist and etching the top electrode; and incorporating the memory array into an integrated circuit.

18 Claims, 14 Drawing Sheets

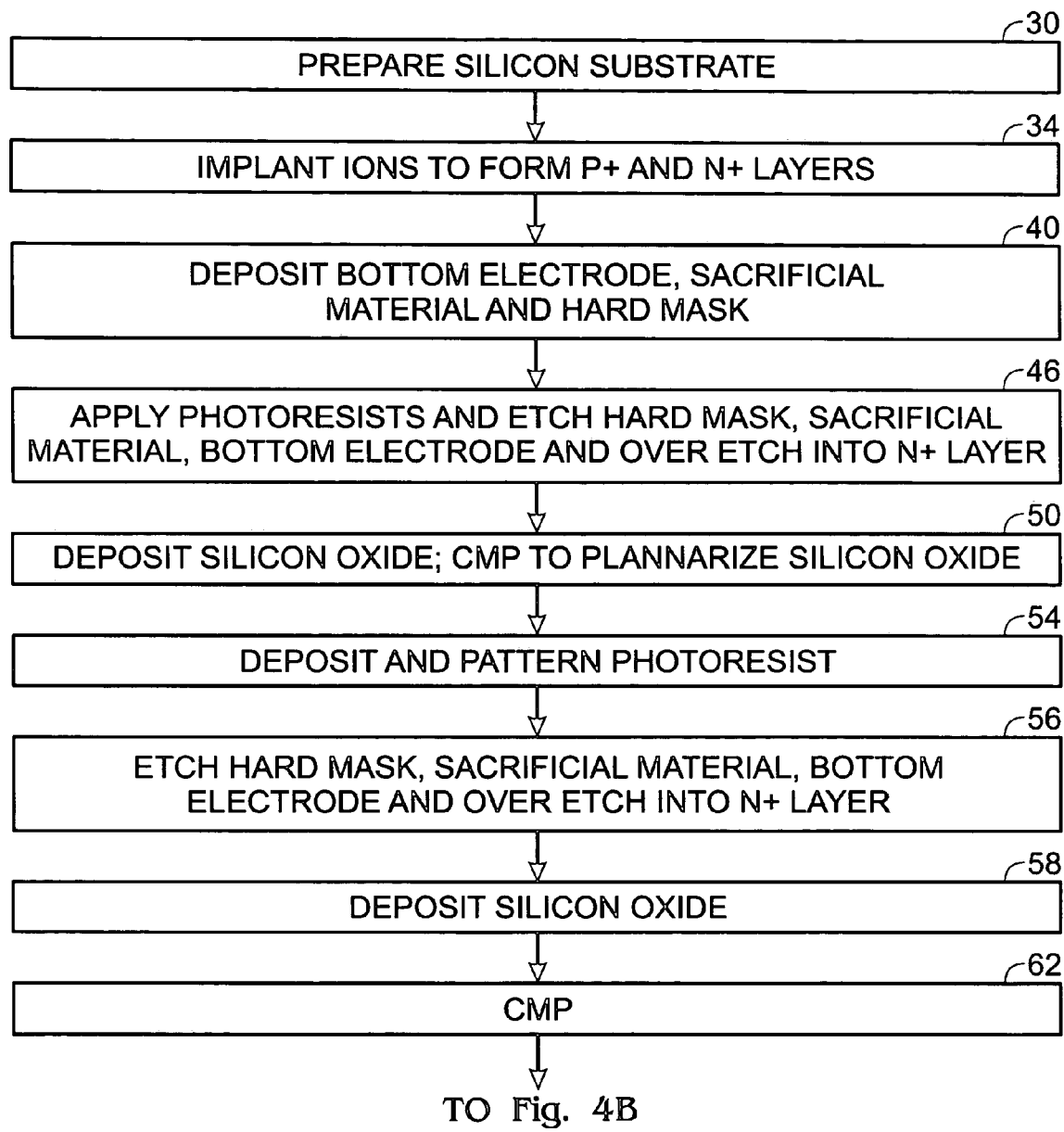

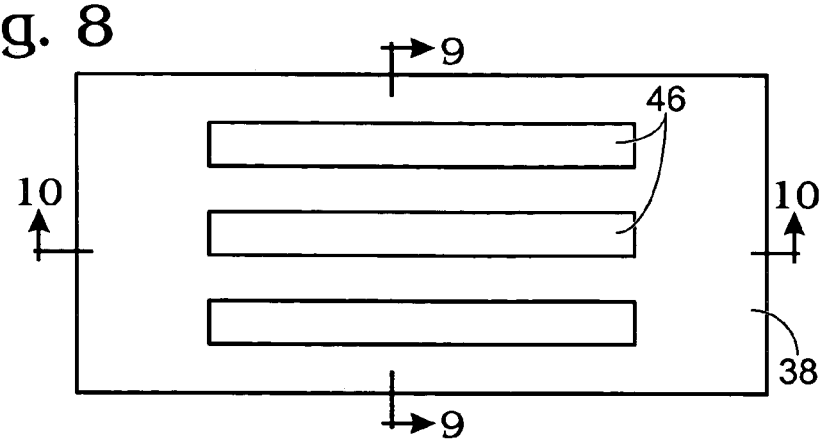
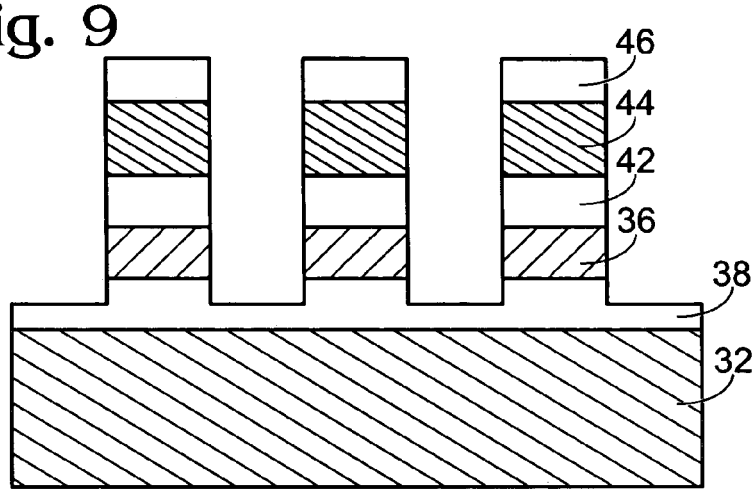
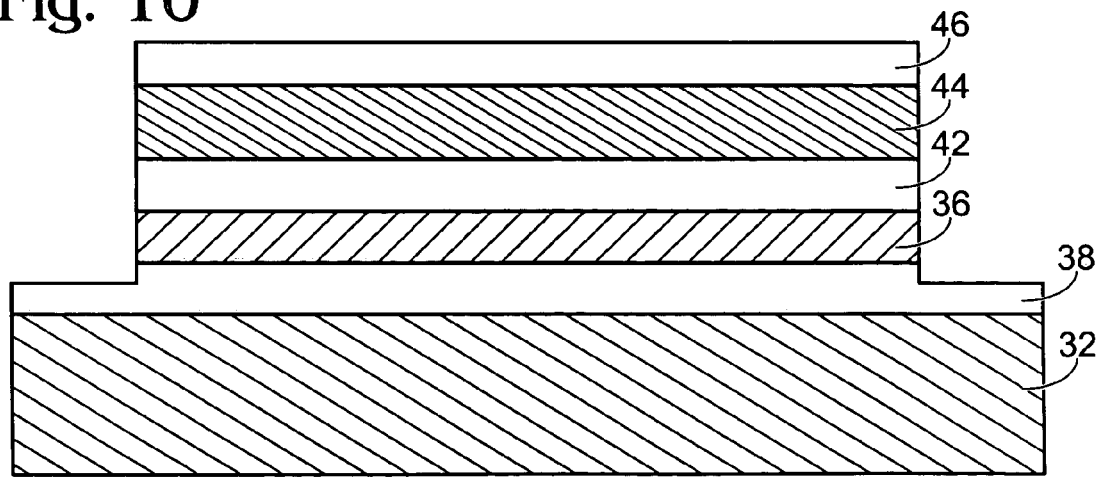

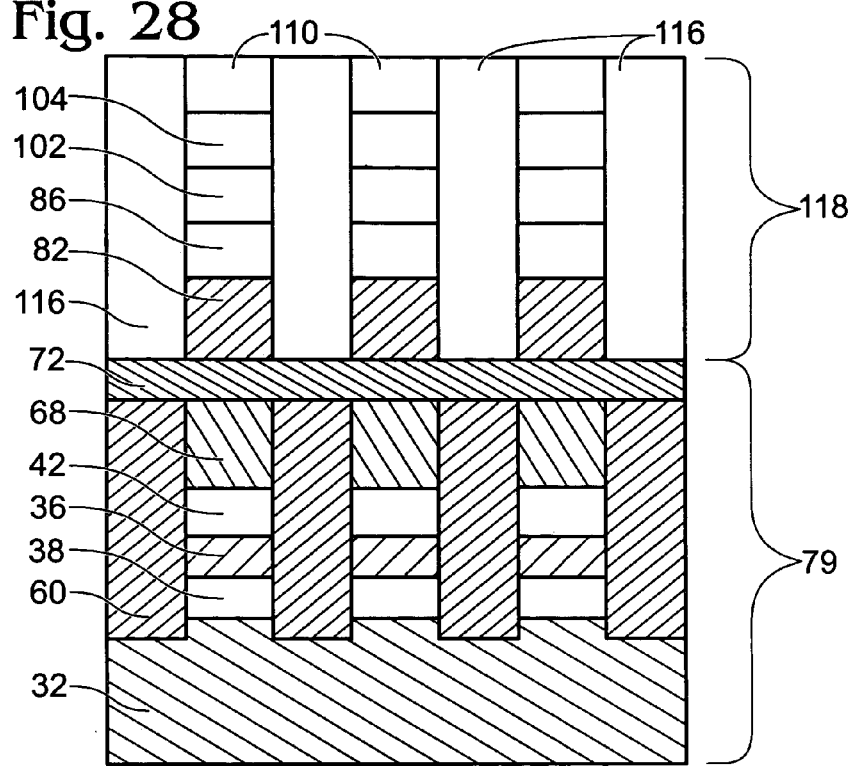
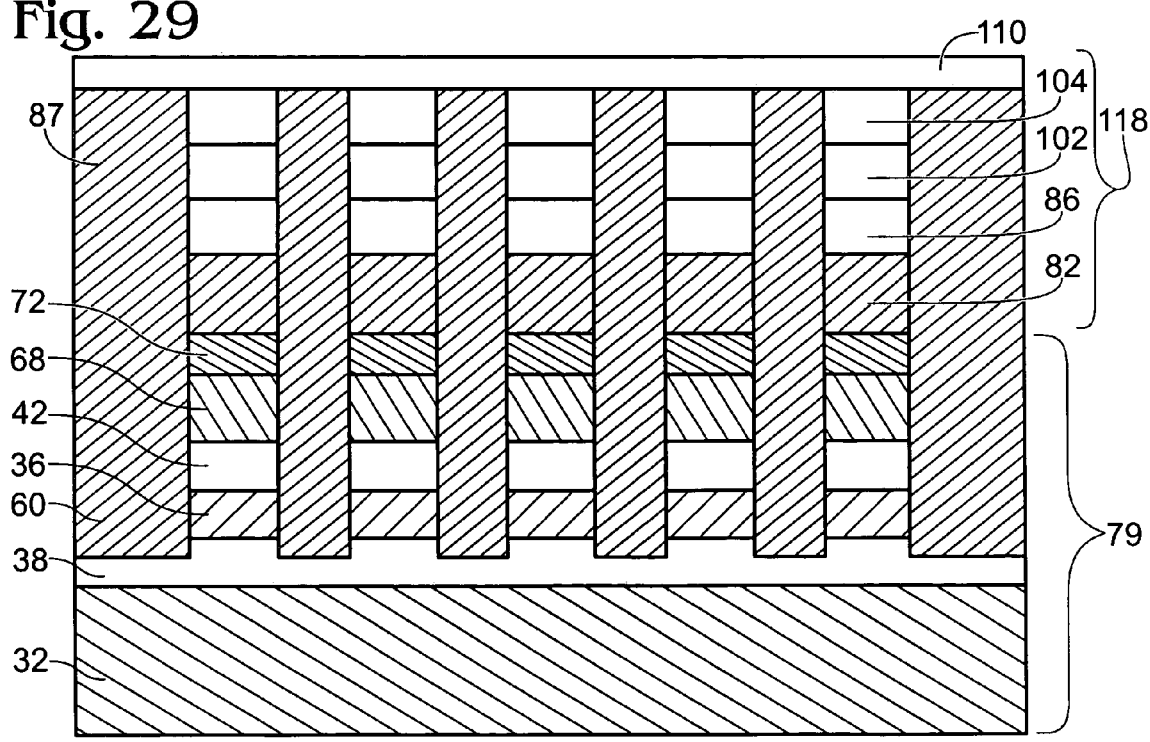

SELF-ALIGNED CROSS POINT RESISTOR MEMORY ARRAY

FIELD OF THE INVENTION

This invention relates to large-scale, non-volatile memory and embedded memory structures, and specifically to a self-aligned cross point resistor memory array, having a single level or multiple levels of memory devices therein.

BACKGROUND OF THE INVENTION

U.S. Pat. No. 6,531,371, granted Mar. 11, 2003, to Hsu et al., for *Electrically Programmable Resistance Cross Point Memory*, describes a memory device having an active layer of perovskite material interposed between upper electrodes and lower electrodes. A bit region located within the active layer at the cross point of an upper electrode and a lower electrode has a resistivity that can change through a range of values in response to application of one, or more, voltage pulses. Voltage pulses may be used to increase the resistivity of the bit region, decrease the resistivity of the bit region, or determine the resistivity of the bit region. Memory periphery circuits are provided to aid in the programming and read out of the bit region.

U.S. Pat. No. 6,693,821, granted Feb. 17, 2004, to Hsu et al., for *Cross-talk Electrically Programmable Resistance Cross Point Memory*, describes a memory device having a bit formed using a perovskite material interposed at a cross point of an upper electrode and lower electrode. Each bit has a resistivity that can change through a range of values in response to application of one, or more, voltage pulses.

U.S. Patent Publication No. 2003/142578 A1, of Hsu et al., for *Electrically Programmable Resistance Cross Point Memory*, published Jul. 31, 2003, describes a memory device having an active layer of perovskite material interposed between upper electrodes and lower electrodes. Voltage pulses may be used to increase the resistivity of the bit region, decrease the resistivity of the bit region, or determine the resistivity of the bit region.

A prior art cross point resistor memory array 10 is depicted in FIGS. 1-3. FIG. 1 is a top plan view of the array, while FIG. 2 is a cross-section taken along line 2-2 of FIG. 1, and FIG. 3 is a cross-section taken along line 3-3 of FIG. 1. Array 10 includes an oxide layer 12, a top electrode 14, a CMR layer 16, a barrier layer 18, a bottom electrode 20, a P+ layer 22, a N+ layer 24 and a silicon substrate 26. CMR memory material 16 is etched using top electrode 14 as a mask. Therefore, along the 2-2 cross-section, the CMR memory material has not been etched, and the CMR material is therefore a continue plate in the 2-2 direction, as shown in FIG. 2. This allows potential cross-talk between adjacent bits in the 2-2 direction.

Liu et al., *Electric-pulse induced reversible resistance change effect in magnetoresistive film*, Applied Physics Letters, Vol. 76, number 19, p. 2749, May 2000, describes the properties of colossal magnetoresistance (CMR) materials.

SUMMARY OF THE INVENTION

A method of fabricating a multi-level self-aligned, cross point resistor memory array for incorporation into an integrated circuit, includes: fabricating a first, odd-number memory array level, including: preparation of a silicon substrate as a memory wafer; implanting ions into the silicon substrate to form a top P+ layer and a buried N+ layer; depositing a bottom electrode, a sacrificial layer, and a hard mask layer on the P+ layer; masking and patterning the hard mask layer; etching to remove an unmasked portion of the hard mask, an unmasked portion of the sacrificial material an unmasked portion of the bottom electrode, and over etching to remove an unmasked portion of the N+ layer; depositing a layer of silicon oxide, having thickness of about 1.5 times that of the total thickness of hard mask and the sacrificial material and the bottom electrode; smoothing the silicon oxide by CMP, stopping at the level of the hard mask; masking and patterning the remaining hard mask layer; etching to remove an unmasked portion of the hard mask, an unmasked portion of the sacrificial material and an unmasked portion of the bottom electrode, and over etching to remove an unmasked portion of the N+ layer and at least 100 nm of the silicon substrate; depositing of a layer of silicon oxide having thickness of about 1.5 times that of the total thickness of hard mask and the sacrificial material and the bottom electrode; smoothing the silicon oxide by CMP, stopping at the level of the hard mask; etching to remove any remaining hard mask and any remaining sacrificial material; depositing a layer of CMR material to a thickness of about 1.5 times of the thickness of the sacrificial material and the hard mask material; smoothing the CMR layer by CMP, stopping at the level of the silicon oxide; depositing a top electrode; applying photoresist, patterning the photoresist and etching the top electrode; and fabricating a second, even-numbered memory array level, including: depositing, on the top electrode, a layer of CMR material; depositing a second bottom electrode on the layer of CMR material, and depositing a conductive oxygen barrier on the CMR layer; depositing a thin layer of conductive bonding material on the conductive oxygen layer; preparing a donor wafer for denotation of a thin layer of silicon to the memory wafer; bonding a silicon layer from the donor wafer to the memory wafer; implanting ions into the bonded silicon layer to form a P/N junction, having a P+ layer and a N+ layer; depositing a second hard mask; depositing and patterning photoresist on the second hard mask; etching the N+ layer, the P+ layer, the CMR layer, stopping at the level of the second bottom electrode; depositing a silicon oxide layer; smoothing the last deposited silicon oxide layer by CMP, stopping at the level of the second hard mask; depositing a second top electrode; depositing and patterning photoresist; etching the second top electrode; depositing a layer of silicon oxide; smoothed the silicon oxide by CMP; and incorporating the self-aligned, cross-point resistor memory array into an integrated circuit.

It is an object of the invention to provide a method of using a high quality single crystalline silicon P/N junction for an upper level memory cell application.

Another object of the invention is to provide a method of fabricating a self-aligned, cross point resistor memory array having at least one level, and for additionally providing a method of fabricating a multi-level self-aligned, cross point resistor memory array.

A further object of the invention is to provides a method to fabricate a completely isolated, yet self-aligned cross point resistance memory array.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIGS. 5-25 depict various stages in fabricating a cross point memory according to the method of the invention.

FIGS. 26-31 depict various stages in fabricating a multi-level cross point memory array according to the method of the invention.

DETAILED DESCRIPTION OF THE PREFERRED EMBODIMENT

Figure 1:
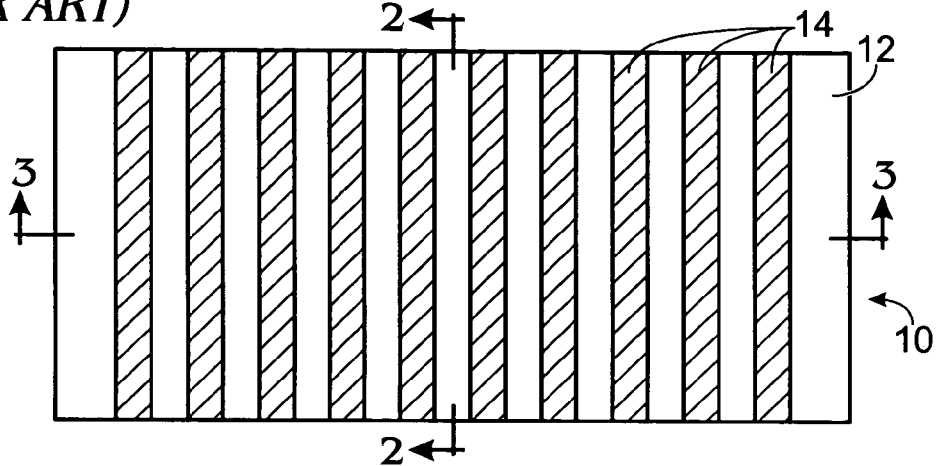
FIGS. 1-3 depicts a prior art cross point resistor memory array.
Figure 2:
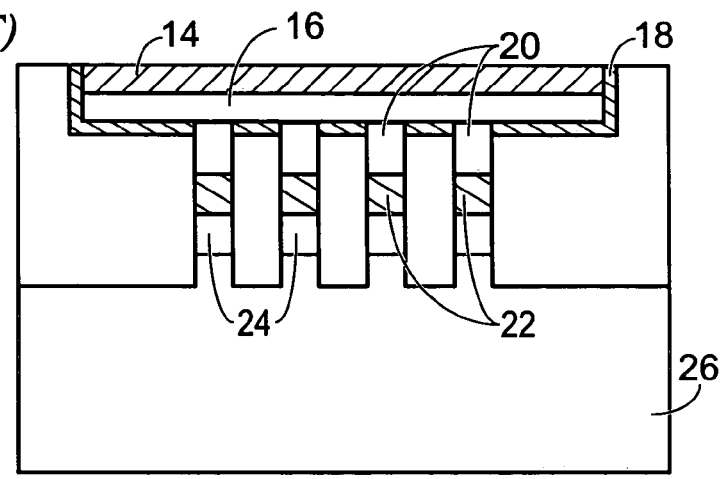
Figure 3:
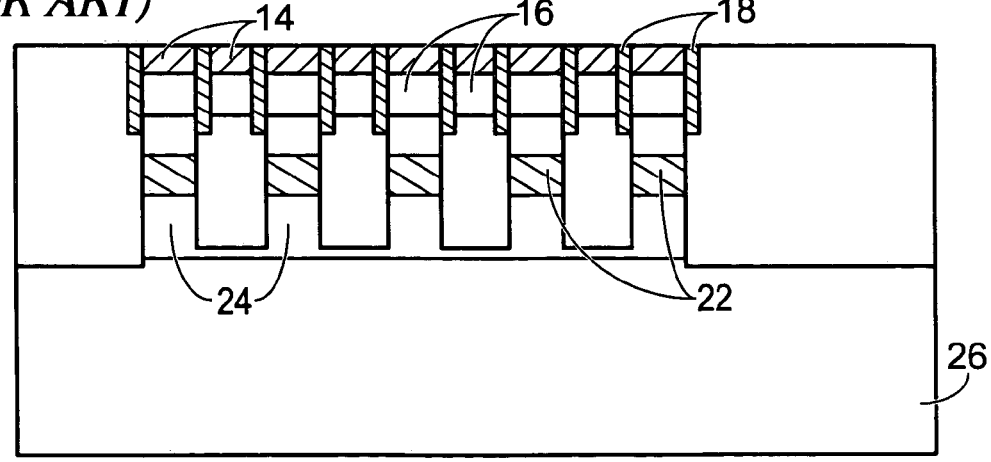

The invention described herein provides improvements to the prior issued patents and published applications listed above for methods of fabricating a high performance electrically programmable resistance (EPR) cross point memory array and a high performance three-dimensional, or multi-level, EPR cross point memory array. The colossal magnetoresistance (CMR) memory material described in the prior art is either etched in the memory array area, or etched using the top electrode as an etching mask. Prior art devices suffer a potential cross talk problem between the adjacent bits common to the top electrode. The method of the invention provides a method to fabricate a completely isolated, yet self-aligned EPR cross point resistance memory array.

This disclosure presents a method for fabricating a completely isolated, yet self-aligned cross point resistor memory array. The memory cell size is maintained at $4F^2$, where F is the minimum feature size of the given integrated circuit fabrication process. Various stages during the fabrication of a single layer, or single level, self-aligned electrically programmable resistance (EPR) cross point resistor memory array are depicted in FIGS. 5-25, and the steps of the method of the invention are depicted in flow-chart form in FIG. 4. A sidewall protection insulator is provided in the structure of the memory array, however, this structure is not shown in the figures for the sake of simplicity. The method of the invention provides a method for fabricating a completely isolated, self-aligned EPR cross point resistor memory array, having a single level, or multi-level configuration.

The fabrication process is as follows, and now referring to FIGS. 4-7: the first step is preparation 30 of a substrate 32. Substrate 32, also referred to herein as a memory wafer, may be a conventional silicon wafer of the p-type or a n-type substrate having a p-well therein. Ions are implanted 34 into silicon substrate 32 to form a top P+ layer 36, having a preferred thickness of between about 10 nm to 40 nm, and a buried N+ layer 38, having a preferred thickness between about 50 nm to 200 nm. Deposition 40 of bottom electrode 42, sacrificial material 44, such as silicon nitride, and of a hard mask 46, is the next step in the fabrication process. The bottom electrode may include an oxygen diffusion barrier and a glue layer, such as a Pt/TiN/Ti stack. The preferred thickness for bottom electrode 42 is between about 20 nm to 60 nm. The hard mask may be $SiO_2$, Ti, or TiN, and the preferred thickness for the sacrificial material is between about 50 nm to 300 nm.

Referring now to FIGS. 4 and 8-10, a layer of photoresist is deposited 48 to provide a mask in the B-B direction, also referred to herein as a first direction. Hard mask 46 is patterned and etched, as is the sacrificial material and the bottom electrode. This etching step includes over etching to remove between about 10 nm to 50 nm of N+ silicon layer 38. The photoresist is removed, resulting in the structure depicted in FIGS. 8-10.

The method of the invention includes deposition 50 a layer of silicon oxide 52, having thickness of about 1.5 times that of hard mask 46, sacrificial material 44 and bottom electrode 42. The structure is smoothed by CMP to planarize the silicon oxide, stopping at the level of hard mask 46, resulting in the structure of FIGS. 11-13.

Figure 14:
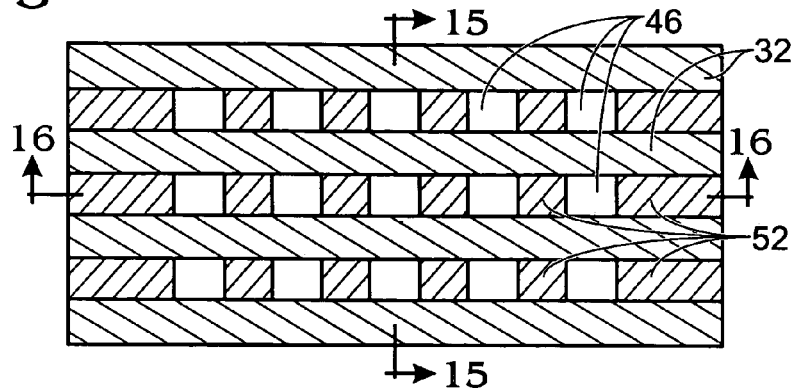
Figure 15:
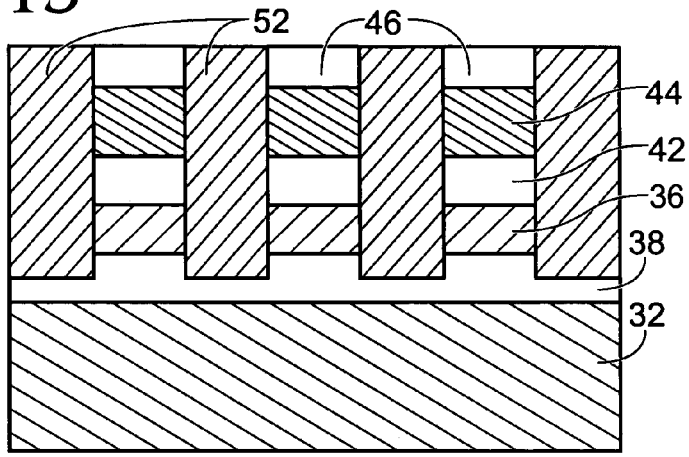
Figure 16:
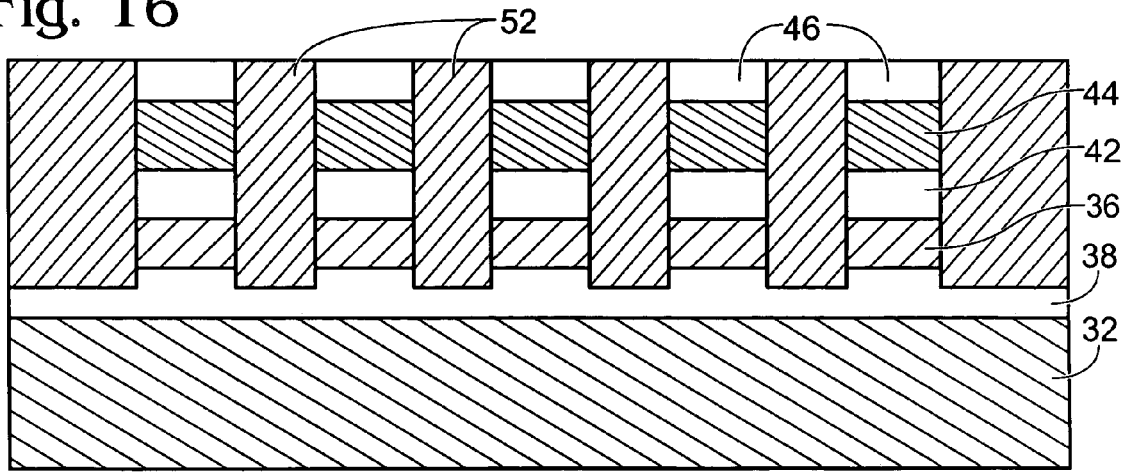
Figure 17:
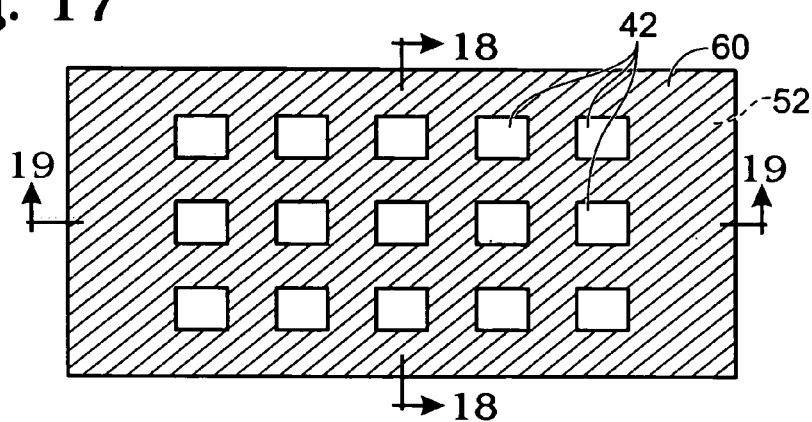
Figure 18:
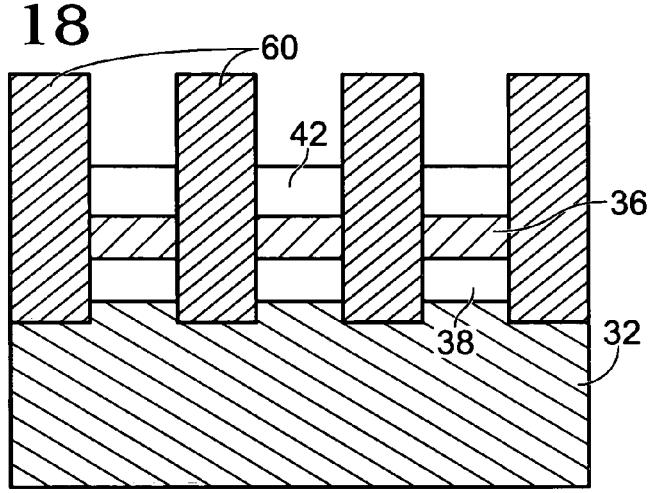
Figure 19:
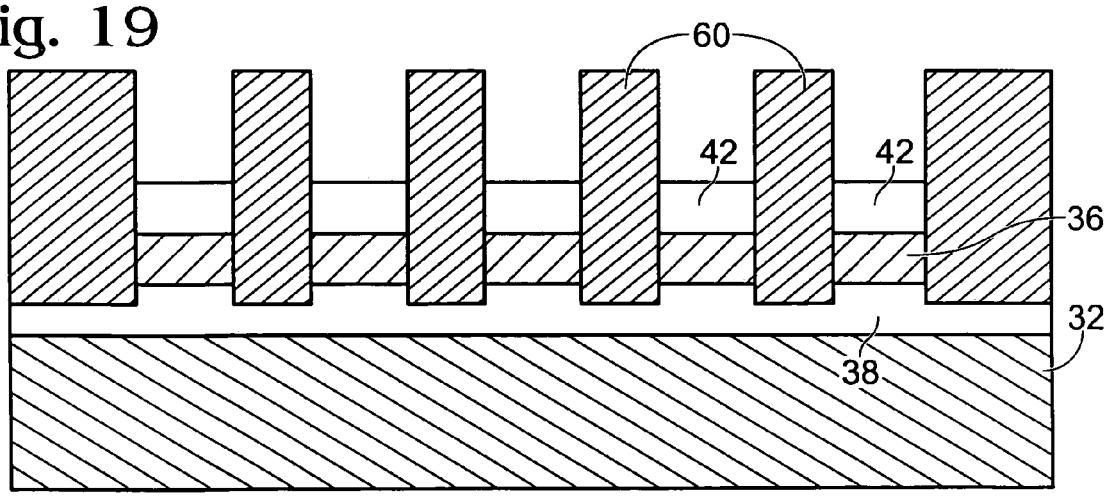
Figure 20:
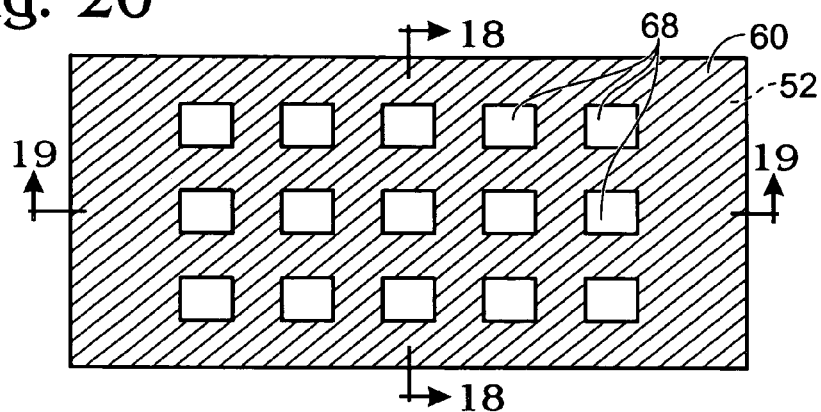
Figure 21:
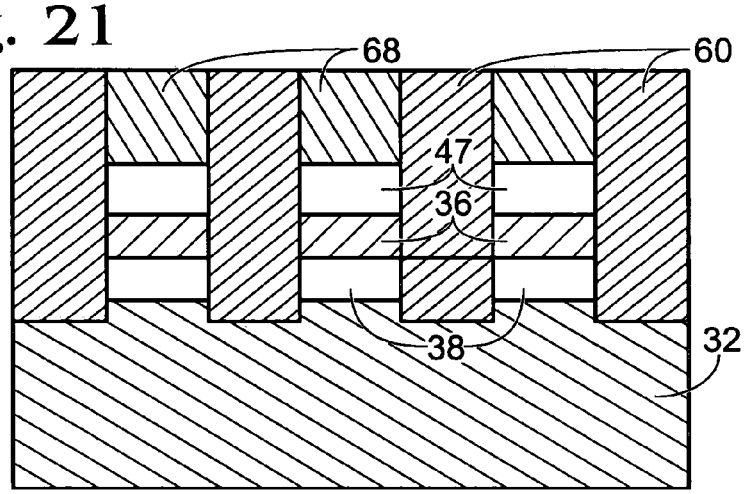
Figure 22:
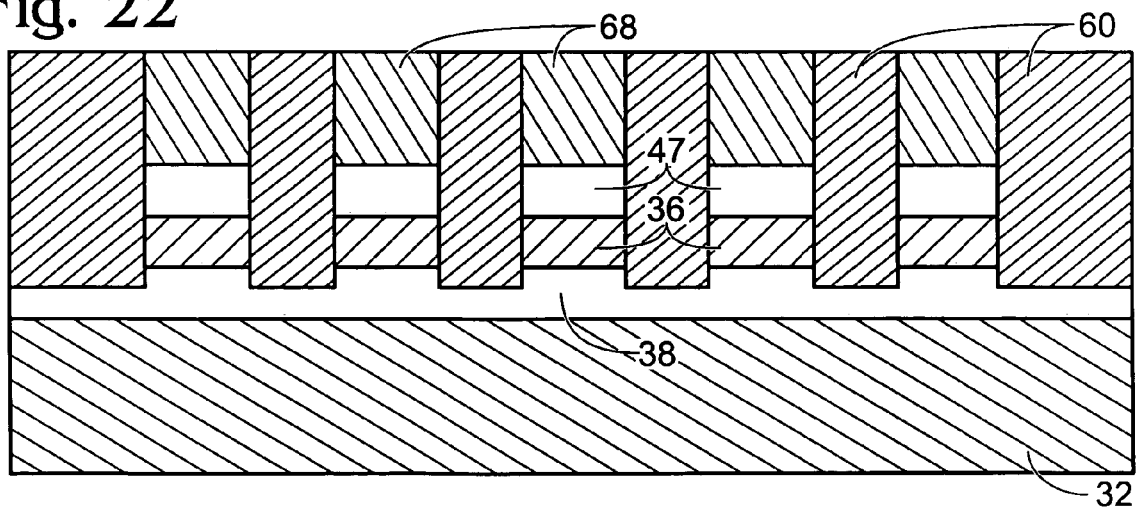

Photoresist is applied 54 to provide a mask in the A-A direction, also referred to herein as a second direction. As is evident from the drawing figures, the second direction is substantially perpendicular to the first direction. The photoresist is patterned, and the structure etched 56, including etching of hard mask 46, sacrificial material 44, bottom electrode 42, the N+ layer 38 (in the A-A direction only), and at least 100 nm of P-substrate 32, as depicted in FIGS. 14-16.

The next step includes deposition 58 of a layer of silicon oxide 60, having thickness, in the A-A direction, of about 1.5 times that of hard mask 46, sacrificial material 44 and bottom electrode 42. The structure is again smoothed by CMP to planarize the oxide, stopping at the level of hard mask 46. The remaining hard mask and the sacrificial material are removed by etching, 64, resulting in the structure depicted in FIGS. 17-19.

Referring now to FIGS. 4 and 20-22, deposition 66 of CMR material 68, or any suitable resistor memory material, to a thickness of about 1.5 times of the thickness of the previously removed sacrificial material and the hard mask material. The CMR material is smoothed by CMP to planarize the CMR material, stopping at the level of the silicon oxide, 60, which refers hereinafter to a combination of oxide layer 52 and oxide layer 60.

Figure 23:
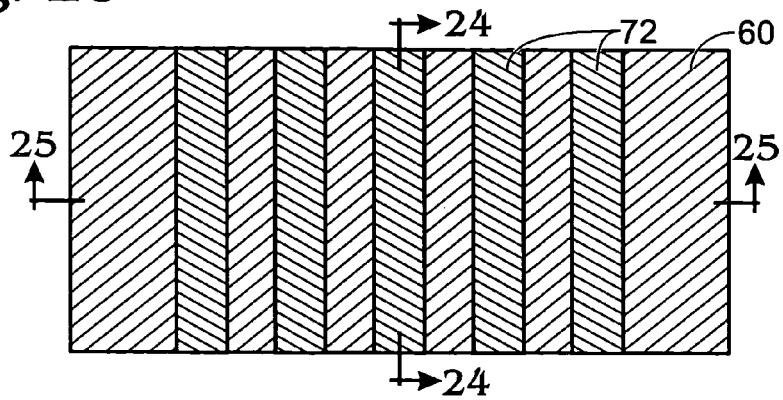
Figure 24:
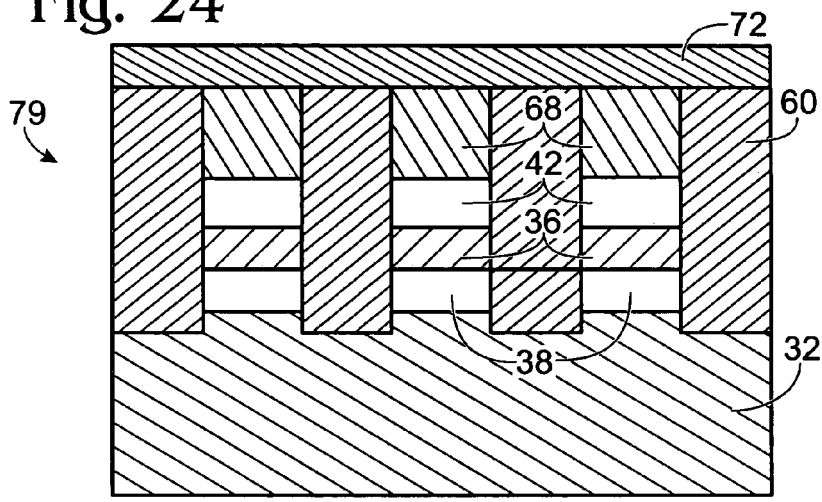
Figure 25:
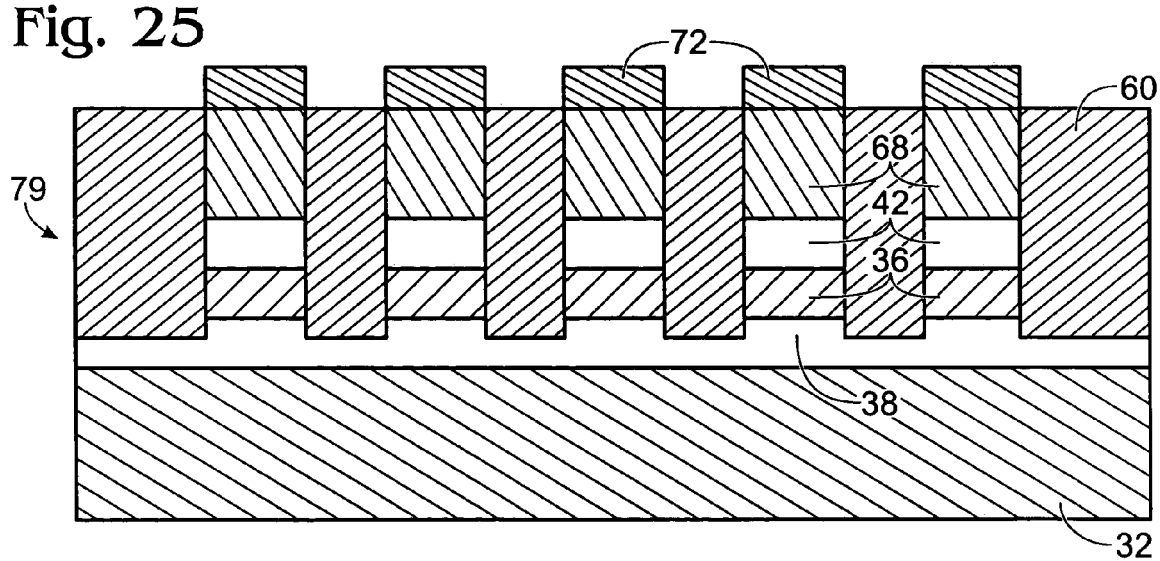

Deposition 70 of a top electrode 72 completes the first level of the self-aligned cross point resistor memory array. The top electrode may be formed of noble material, such as platinum, gold, silver, titanium or tantalum, and is deposited to a thickness of between about 200 nm to 600 nm. An optional oxygen diffusion barrier, such as TiN or TaN, may be included at this point on the top electrode is the single level memory array is to be the final structure, as shown in FIGS. 23-25. Photoresist is applied 74, and top electrode 72 etched 76. The finished, isolated self-aligned cross point resistor memory array 79 is incorporated 78 into an integrated circuit if this is the end of the fabrication process.

The above-described method is directed to a single level EPR self-aligned cross point resistor memory array, wherein each memory resistor is fabricated in series with a P/N junction, to avoid cross talk and interference during programming processes. A multi-level, or three-dimensional, EPR cross point resistor memory array may be fabricated using re-crystallization of a deposited polysilicon layer for fabrication of P/N junctions for a memory array fabricated above the initial EPR cross point resistor memory array according to the prior art. However, as it is well known that the leakage current of a recrystallized polysilicon P/N junction is relatively high, this process may not suitable for high-density, large-scale memory array fabrication. To solve this problem, a method of using high quality, single crystalline silicon P/N junctions for upper level memory cells is described herein. Fabrication of additional levels, or layers, for a multi-level memory array include, following deposition 70 of top electrode 72, omitting the oxygen diffusion barrier, and now referring to FIGS. 4 and 26-27, depositing 80 memory resistor material 82, such as CMR material, and depositing 84 a second bottom electrode 86 and a conductive oxygen barrier. Deposition 90 of a thin layer of conductive bonding material that is used to bond a silicon single crystal layer to the memory wafer. The conductive bonding material may be a thin layer of polycrystalline silicon and metal silicide, such as $TiSi_2$, $WSi_2$, $NiSi$, $CoSi_2$, or $PtSi_2$.

Figure 26:
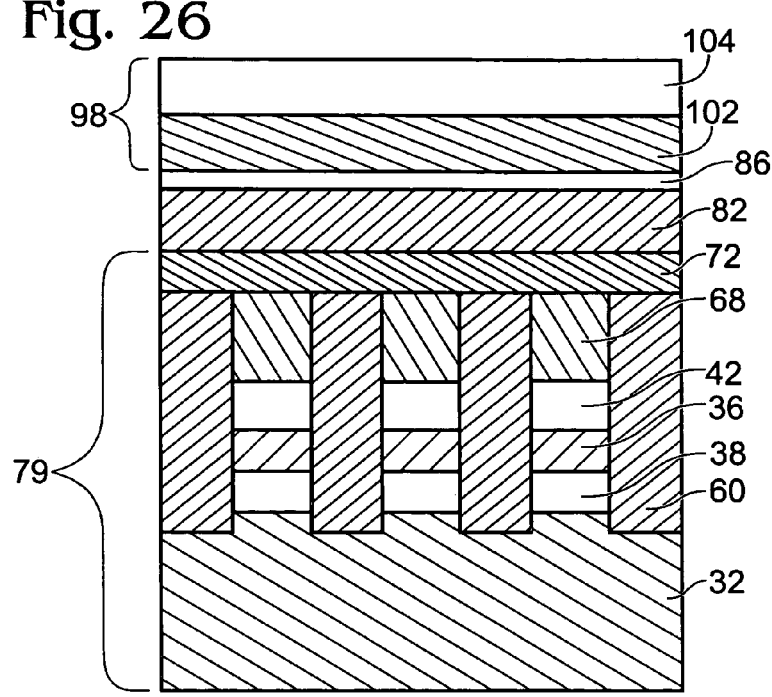
Figure 27:
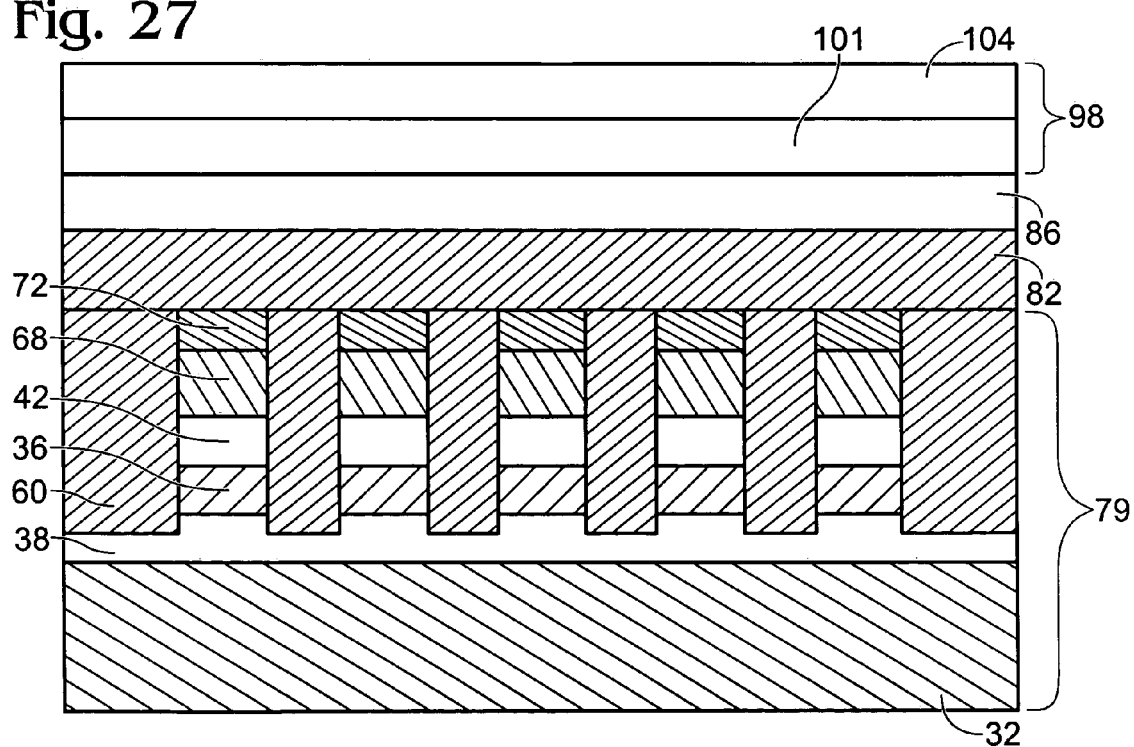

A donor wafer is prepared 92 to donate a thin layer of silicon to the memory wafer. This may be accomplished using any state-of-the-art process, such as the SmartCut™ process. Bonding 96 of a silicon layer, having a thickness of between about 200 nm to 1000 nm, from the donor wafer to the memory wafer is accomplished by any well known bonding process, as used for any silicon-on-insulator bonding process, even though the silicon is going to be bonded on metal silicide. Ion implantation 100 is performed to form a P/N junction, having a P+ layer 102 and a N+ layer 104, as depicted in FIGS. 26-27.

Referring now to FIGS. 28-29, deposition 106 of a second hard mask, photoresist deposition and patterning, etching the memory stack of N+ layer 104, P+ layer 102, CMR layer 82, stopping at the level of second bottom electrode 86, provides isolation of the P/N junctions. The etching process may require a two-step effort. The photoresist is stripped. A layer of oxide, 87, is deposited, and smoothed by CMP. The next step includes deposition 108 of a second top electrode 110. Photoresist is applied, pattered and the top electrode etched, 112. A layer of oxide 116 is deposited 114, and smoothed by CMP, resulting in a second level of a self-aligned, cross point resistor memory array 118. If a two-level memory array is the final structure, the structure is completed by incorporation into an integrated circuit.

Figure 4B:
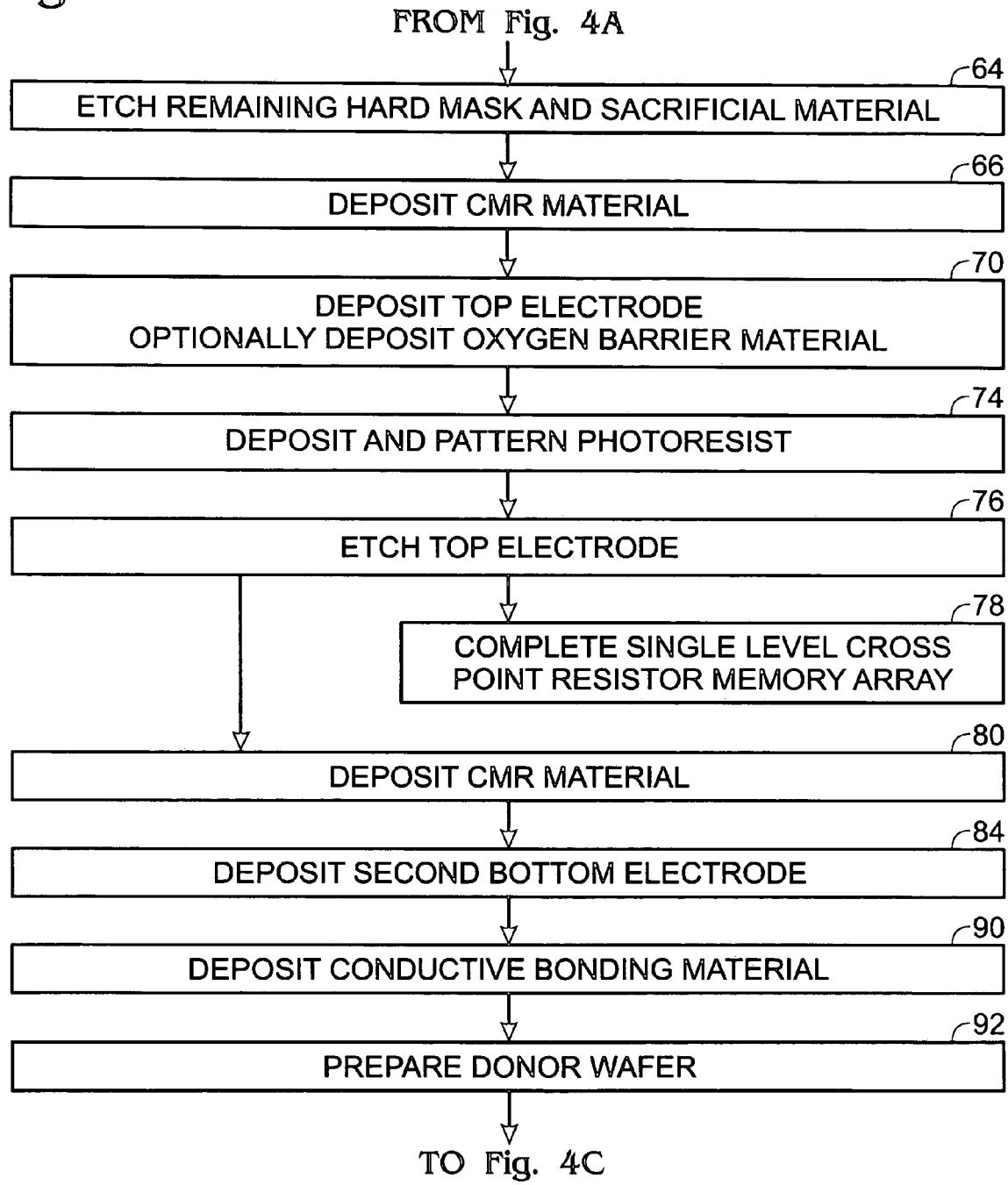
FIG. 4 is a block diagram of the method of the invention.
Figure 4C:
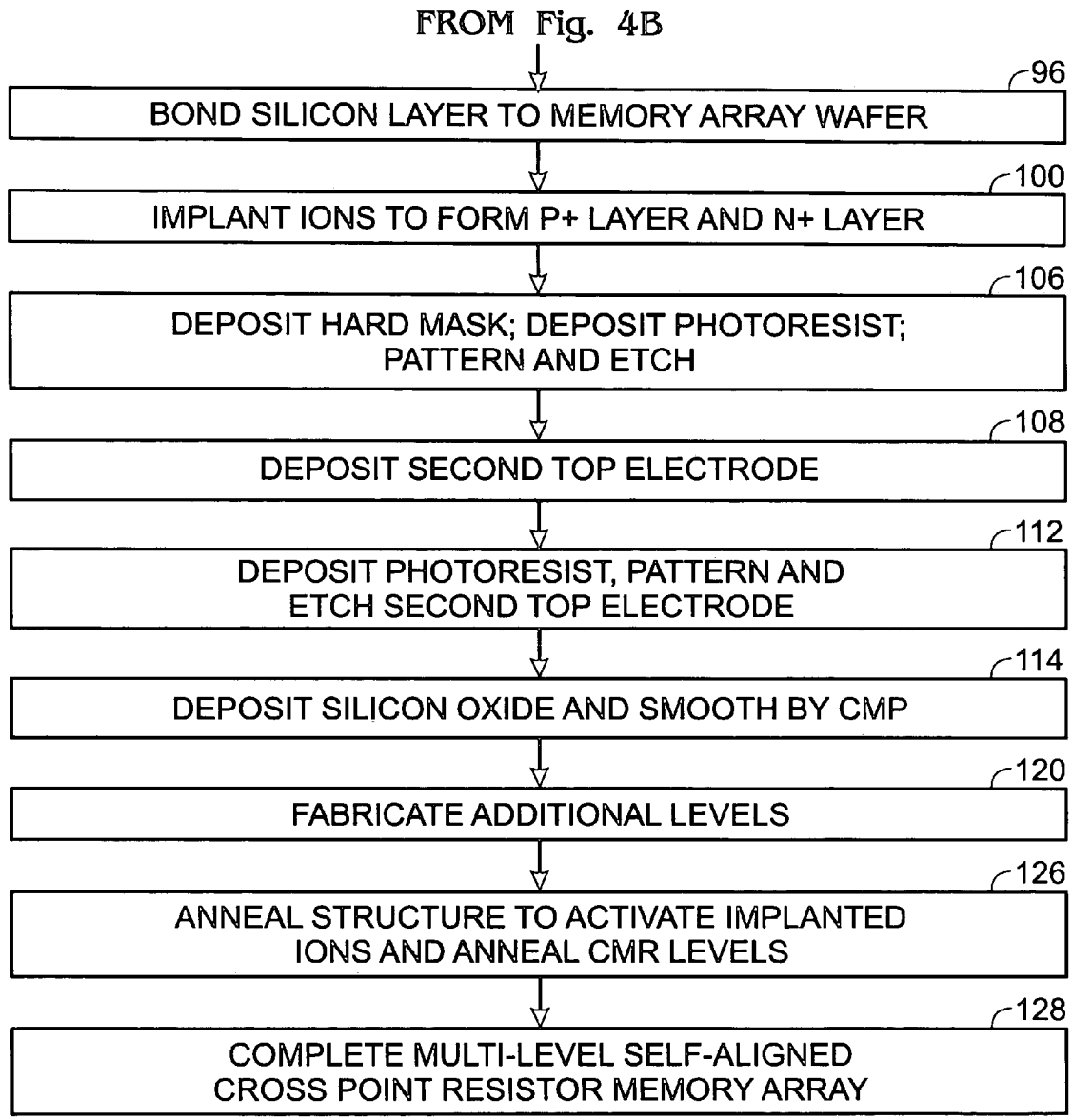
Figure 5:
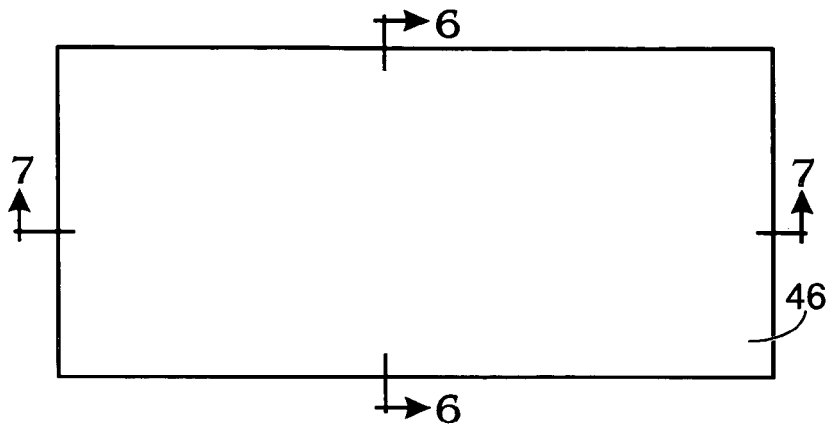
Figure 6:
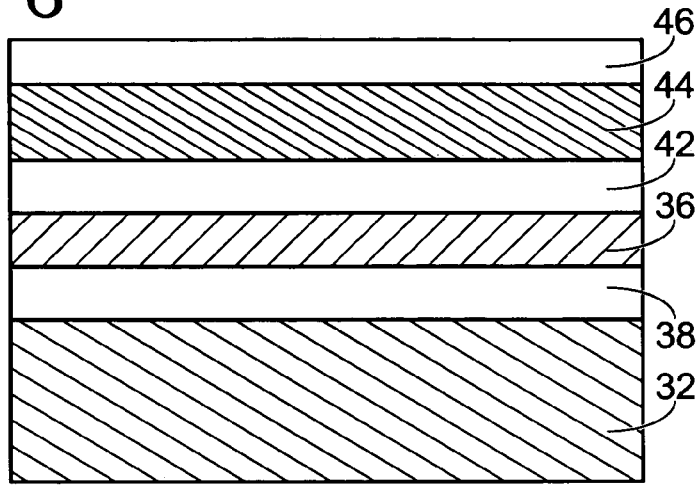
Figure 7:
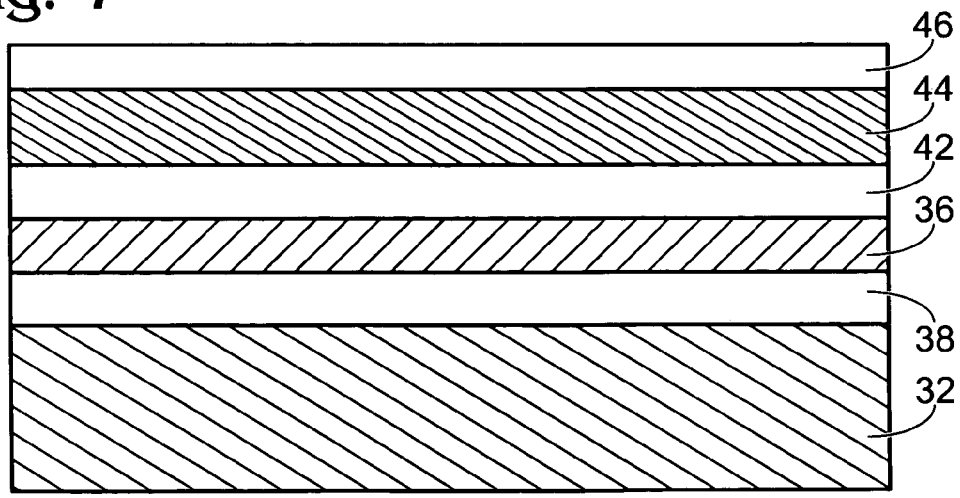
Figure 11:
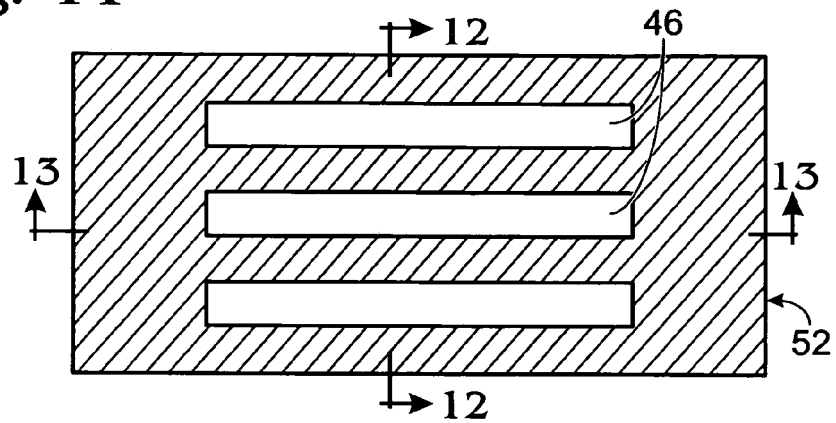
Figure 12:
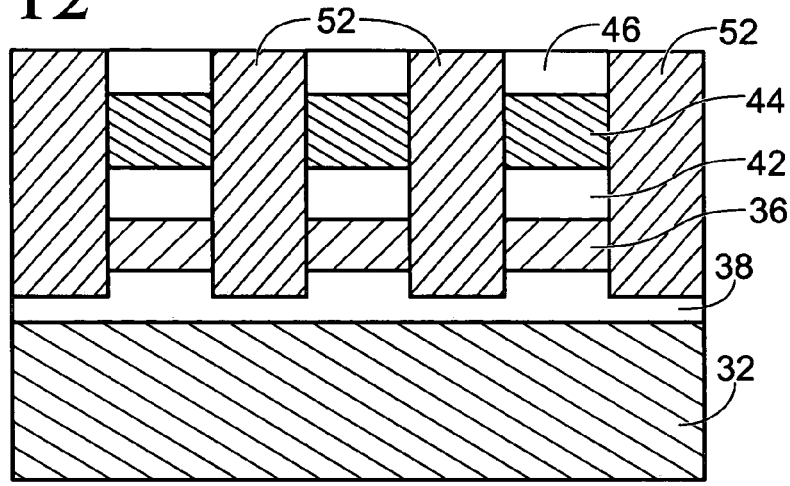
Figure 13:
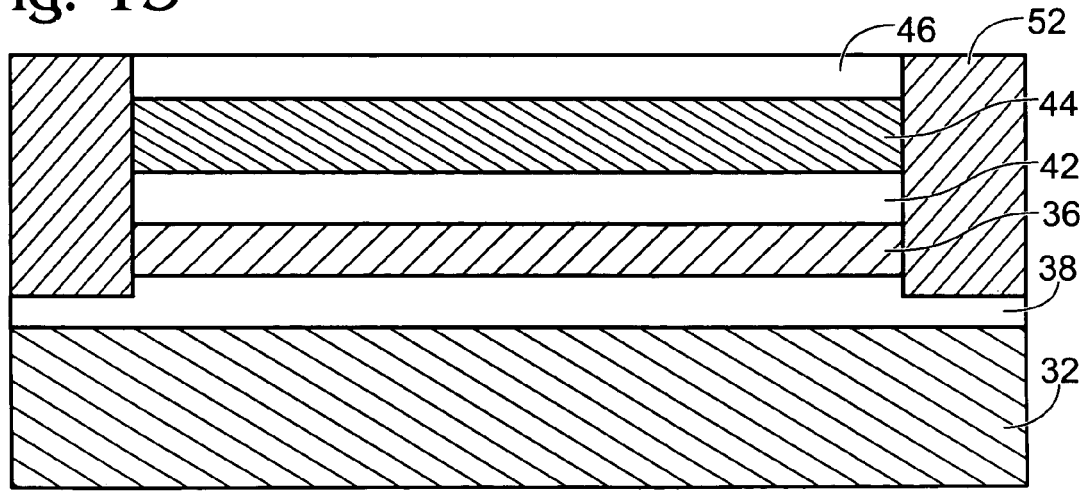
Figure 31:
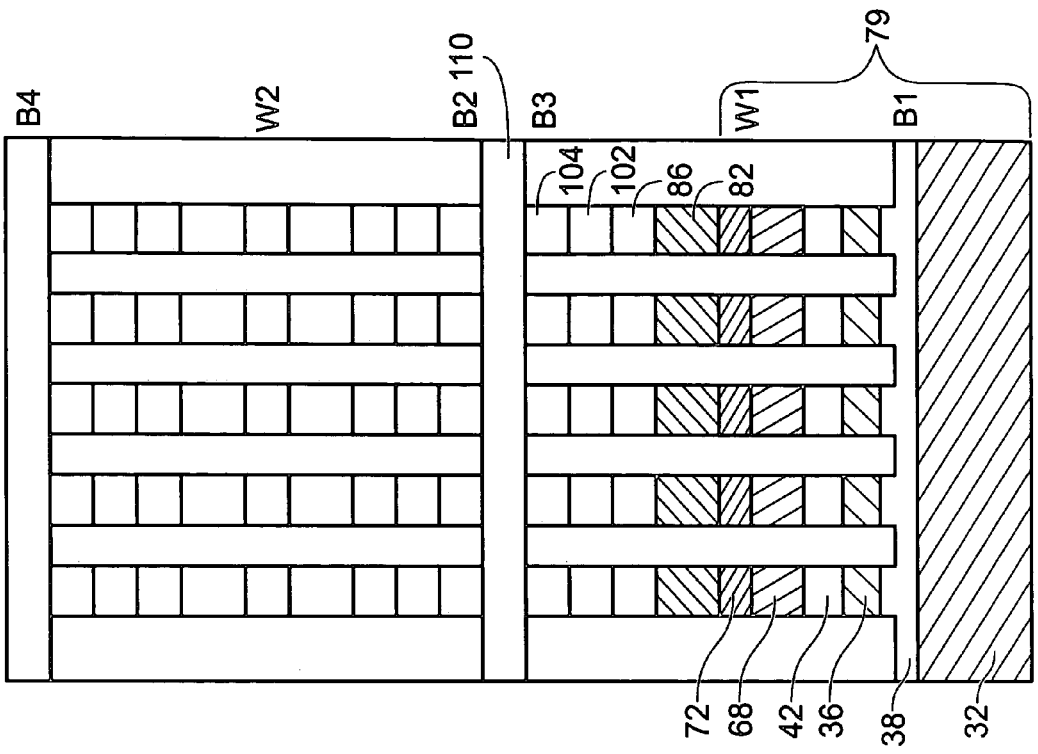
Figure 30:
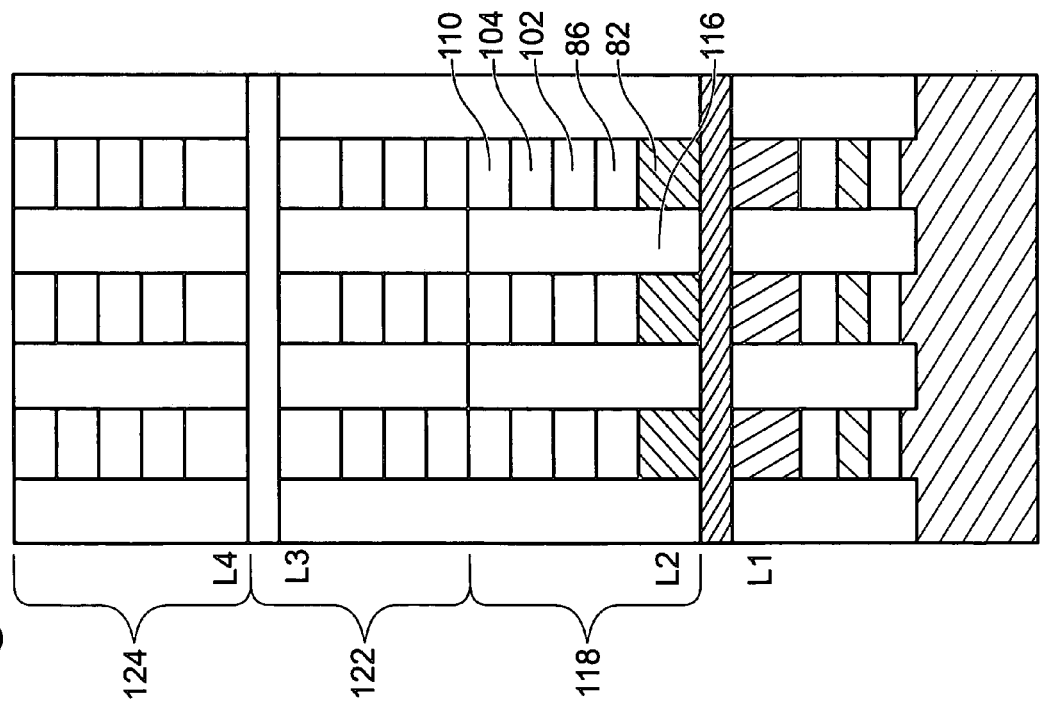

Referring now to FIGS. 4 and 30-31, additional levels may be fabricated 120. A third level self-aligned, EPR cross point resistor memory array 122 may be fabricated according to the method of the invention as applied to first level 79; a fourth level self-aligned, EPR cross point resistor memory array 124 may be fabricated according to the method of the invention as applied to second level 118.

This method may be repeated to any number of times for any number of memory level fabrications. In order to minimize the thermal budget, implanted ions are not activated after each ion implantation. A single annealing step 126 is used to activate all ion implantations and annealing of CMR films after all levels are formed. The multi-level self-aligned, cross point resistor memory array is incorporated into a finished integrated circuit device 128.

Thus, a method of fabricating a single or multi-level self-aligned, cross point resistor memory array has been disclosed. It will be appreciated that further variations and modifications thereof may be made within the scope of the invention as defined in the appended claims.

We claim:

1. A method of fabricating a self-aligned, cross point resistor memory array for incorporation into an integrated circuit, comprising:
    preparation of a silicon substrate as a memory wafer;
    implanting ions into the silicon substrate to form a top P+ layer and a buried N+ layer;
    depositing a bottom electrode, a sacrificial layer, and a hard mask layer on the P+ layer;
    masking and patterning the hard mask layer defining a pattern in a first direction;
    etching to remove an unmasked portion of the hard mask, an unmasked portion of the sacrificial material an unmasked portion of the bottom electrode, and over etching to remove an unmasked portion of the N+ layer;
    depositing a layer of silicon oxide, having thickness of about 1.5 times that of the total thickness of hard mask and the sacrificial material and the bottom electrode;
    smoothing the silicon oxide by CMP, stopping at the level of the hard mask;
    masking and patterning the remaining hard mask layer defining a pattern in a second direction which is substantially perpendicular to the first direction;
    etching to remove an unmasked portion of the hard mask, an unmasked portion of the sacrificial material an unmasked portion of the bottom electrode, and over etching to remove an unmasked portion of the N+ layer and at least 100 nm of the silicon substrate;
    depositing of a layer of silicon oxide having thickness of about 1.5 times that of the total thickness of hard mask and the sacrificial material and the bottom electrode;
    smoothing the silicon oxide by CMP, stopping at the level of the hard mask;
    etching to remove any remaining hard mask and any remaining sacrificial material;
    depositing a layer of CMR material to a thickness of about 1.5 times of the thickness of the sacrificial material and the hard mask material;
    smoothing the CMR material by CMP, stopping at the level of the last deposited silicon oxide;
    depositing a top electrode;
    applying photoresist, patterning the photoresist and etching the top electrode; and
    incorporating the memory array into an integrated circuit.

2. The method of claim 1 wherein the silicon substrate is silicon wafer taken from the group of silicon substrates consisting of p-type substrates and n-type substrates having a p-well therein.

3. The method of claim 1 wherein said implanting ions into the silicon substrate to form a top P+ layer and a buried N+ layer includes implanting ions to form a P+ layer having a thickness of between about 10 nm to 40 nm and implanting ions to form a N+ layer having a thickness of between about 50 nm to 200 nm.

4. The method of claim 1 wherein said depositing a bottom electrode includes depositing an oxygen diffusion barrier and a glue layer on the bottom electrode.

5. The method of claim 1 wherein said depositing a top electrode includes depositing an oxygen diffusion barrier on the top electrode; and which further includes annealing the memory array to activate the implanted ions and to anneal the CMR layer.

6. The method of claim 1 which further includes depositing another level memory array, comprising:
    depositing a layer of silicon oxide having a thickness of about 1.5 times that of the top electrode;
    smoothing the silicon oxide by CMP, stopping at the level of the top electrode;
    depositing, on the top electrode, a layer of CMR material;
    depositing a second bottom electrode on the layer of CMR material, and depositing a conductive oxygen barrier on the CMR layer;
    depositing a thin layer of conductive bonding material on the conductive oxygen layer;
    preparing a donor wafer for denotation of a thin layer of silicon to the memory wafer;
    bonding a silicon layer from the donor wafer to the memory wafer;
    implanting ions into the bonded silicon layer to form a P/N junction, having a deep P+ layer and a shallow N+ layer;
    depositing a second hard mask;
    depositing and patterning photoresist on the second hard mask defining a pattern in a first direction;
    etching the of N+ layer, the P+ layer, the CMR layer, stopping at the level of the second bottom electrode;
    depositing a layer of oxide to a thickness of about 1.5 times that of the combined thickness of the N+ layer, the P+ layer, the CMR layer and the second hard mask layer;
    smoothing the last deposited silicon oxide layer by CMP, stopping at the level of the second hard mask layer;
    etching to the level of the second hard mask layer;
    depositing a second bottom electrode;
    depositing and patterning photoresist defining a pattern in a second direction which is substantially perpendicular to the first direction;

etching the second bottom electrode;
depositing a layer of silicon oxide on the second bottom electrode;
smoothing the silicon oxide by CMP; and
incorporating the second level of a self-aligned, cross-point resistor memory array integrated circuit.

7. The method of claim 6 which includes fabrication of a third memory array level according to the method of claim 1 wherein the silicon N+ layer and P+ layer is a bonded silicon having a deep N+ ion implant and a shallow P+ ion implant.

8. The method of claim 7 which includes fabrication of a fourth memory array level according to the method of claim 6.

9. The method of claim 6 wherein said depositing a top electrode includes depositing an oxygen diffusion barrier on the top electrode; and which further includes annealing the memory array to active the implanted ions and to anneal the CMR layer.

10. A method of fabricating a multi-level self-aligned, cross point resistor memory array for incorporation into an integrated circuit, comprising: fabricating a first memory array level, including:
preparation of a silicon substrate as a memory wafer;
implanting ions into the silicon substrate to form a top P+ layer and a buried N+ layer;
depositing a bottom electrode, a sacrificial layer, and a hard mask layer on the P+ layer;
masking and patterning the hard mask layer defining a pattern in a first direction;
etching to remove an unmasked portion of the hard mask, an unmasked portion of the sacrificial material an unmasked portion of the bottom electrode, and over etching to remove an unmasked portion of the N+ layer;
depositing a layer of silicon oxide, having thickness of about 1.5 times that of the total thickness of hard mask and the sacrificial material and the bottom electrode;
smoothing the silicon oxide by CMP, stopping at the level of the hard mask;
masking and patterning the remaining hard mask layer defining a pattern in a second direction which is substantially perpendicular to the first direction;
etching to remove an unmasked portion of the hard mask, an unmasked portion of the sacrificial material an unmasked portion of the bottom electrode, and over etching to remove an unmasked portion of the N+ layer and at least 100 nm of the silicon substrate;
depositing of a layer of silicon oxide having thickness of about 1.5 times that of the total thickness of hard mask and the sacrificial material and the bottom electrode;
smoothing the silicon oxide by CMP, stopping at the level of the hard mask;
etching to remove any remaining hard mask and any remaining sacrificial material;
depositing a layer of CMR material to a thickness of about 1.5 times of the thickness of the sacrificial material and the hard mask material;
smoothing the CMR material by CMP, stopping at the level of the last deposited silicon oxide;
depositing a top electrode;
applying photoresist, patterning the photoresist and etching the top electrode; and fabricating a second memory array level, including:
depositing a layer of silicon oxide having a thickness of about 1.5 times that of the top electrode;
smoothing the last deposited silicon oxide layer by CMP, stopping at the level of the top electrode;
depositing, on the top electrode, a layer of CMR material;
depositing a second bottom electrode on the layer of CMR material, and depositing a conductive oxygen barrier on the CMR layer;
depositing a thin layer of conductive bonding material on the conductive oxygen layer;
preparing a donor wafer for denotation of a thin layer of silicon to the memory wafer;
bonding a silicon layer from the donor wafer to the memory wafer;
implanting ions into the bonded silicon layer to form a P/N junction, having a P+ layer and a N+ layer;
depositing a second hard mask;
depositing and patterning photoresist on the second hard mask defining a pattern extending in a first direction;
etching the of N+ layer, the P+ layer, the CMR layer, stopping at the level of the second bottom electrode;
depositing a layer of silicon oxide having a thickness of about 1.5 times that of the combined thickness of the N+ layer, the P+ layer and the CMR material layer;
smoothing the last deposited silicon oxide layer, stopping at the level of the CMR material layer;
depositing a second top electrode;
depositing and patterning photoresist defining a pattern extending in a second direction which is substantially perpendicular to the first direction;
etching the second top electrode;
depositing a layer of silicon oxide;
smoothing the last deposited silicon oxide layer by CMP, stopping at the level of the second top electrode; and
incorporating the self-aligned, cross-point resistor memory array into an integrated circuit.

11. The method of claim 10 wherein the silicon substrate is silicon wafer taken from the group of silicon substrates consisting of p-type substrates and p-well of N+ type silicon substrates.

12. The method of claim 10 wherein said implanting ions into the silicon substrate to form a top P+ layer and a buried N+ layer includes implanting ions to form a P+ layer having a thickness of between about 10 nm to 40 nm and implanting ions to form a N+ layer having a thickness of between about 50 nm to 200 nm.

13. The method of claim 10 wherein said depositing a bottom electrode includes depositing an oxygen diffusion barrier and a glue layer on the bottom electrode.

14. The method of claim 10 wherein said depositing a top electrode includes depositing an oxygen diffusion barrier on the top electrode; and which further includes annealing the memory array to active the implanted ions and to anneal the CMR layer.

15. The method of claim 10 which includes fabrication of a third memory array level according to the method of claim 10 for fabricating a first memory array level.

16. The method of claim 10 which includes fabrication of a fourth memory array level according to the method of claim 10 for fabricating a second memory array level.

17. The method of claim 10 wherein said depositing a top electrode includes, for the top electrode of a multi-level memory array, depositing an oxygen diffusion barrier on the top electrode.

18. The method of claim 10 which further includes annealing the memory array to active the implanted ions and to anneal the CMR layer.

* * * * *